United States Patent
Collins et al.

(10) Patent No.: US 10,214,807 B2
(45) Date of Patent: Feb. 26, 2019

(54) ATOMIC LAYER DEPOSITION OF TUNGSTEN FOR ENHANCED FILL AND REDUCED SUBSTRATE ATTACK

(71) Applicant: Lam Research Corporation, Fremont, CA (US)

(72) Inventors: Joshua Collins, Sunnyvale, CA (US); Siew Neo, Sunnyvale, CA (US); Hanna Bamnolker, Cuptertino, CA (US); Kapil Umesh Sawlani, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/171,187

(22) Filed: Jun. 2, 2016

(65) Prior Publication Data

US 2017/0350008 A1    Dec. 7, 2017

(51) Int. Cl.
| | | |
|---|---|---|
| *C23C 16/00* | (2006.01) | |
| *C23C 16/02* | (2006.01) | |
| *C23C 16/04* | (2006.01) | |
| *C23C 16/14* | (2006.01) | |
| *C23C 16/455* | (2006.01) | |

(52) U.S. Cl.
CPC ........ *C23C 16/0272* (2013.01); *C23C 16/045* (2013.01); *C23C 16/14* (2013.01); *C23C 16/45527* (2013.01)

(58) Field of Classification Search
CPC ........ C23C 16/45525; C23C 16/45527; C23C 16/45529
See application file for complete search history.

(56) References Cited

U.S. PATENT DOCUMENTS

| | | | |
|---|---|---|---|
| 2013/0302980 A1* | 11/2013 | Chandrashekar | ............................ H01L 21/76877 438/666 |
| 2014/0147589 A1* | 5/2014 | Khandelwal | ........ C23C 16/0281 427/250 |
| 2015/0325475 A1 | 11/2015 | Bamnolker et al. | |
| 2016/0284553 A1* | 9/2016 | Suzuki | .............. H01L 21/76883 |
| 2016/0348234 A1* | 12/2016 | Suzuki | .................. C23C 16/045 |

* cited by examiner

*Primary Examiner* — Kelly M Gambetta

(57) ABSTRACT

A method for depositing tungsten includes arranging a substrate including a titanium nitride layer in a substrate processing chamber and performing multi-stage atomic layer deposition of tungsten on the substrate using a precursor gas includes tungsten chloride (WClx) gas, wherein x is an integer. The performing includes depositing the tungsten during a first ALD stage using a first dose intensity of the precursor gas, and depositing the tungsten during a second ALD stage using a second dose intensity of the precursor gas. The first dose intensity is based on a first dose concentration and a first dose period. The second dose intensity is based on a second dose concentration and a second dose period. The second dose intensity is 1.5 to 10 times the first dose intensity.

14 Claims, 4 Drawing Sheets

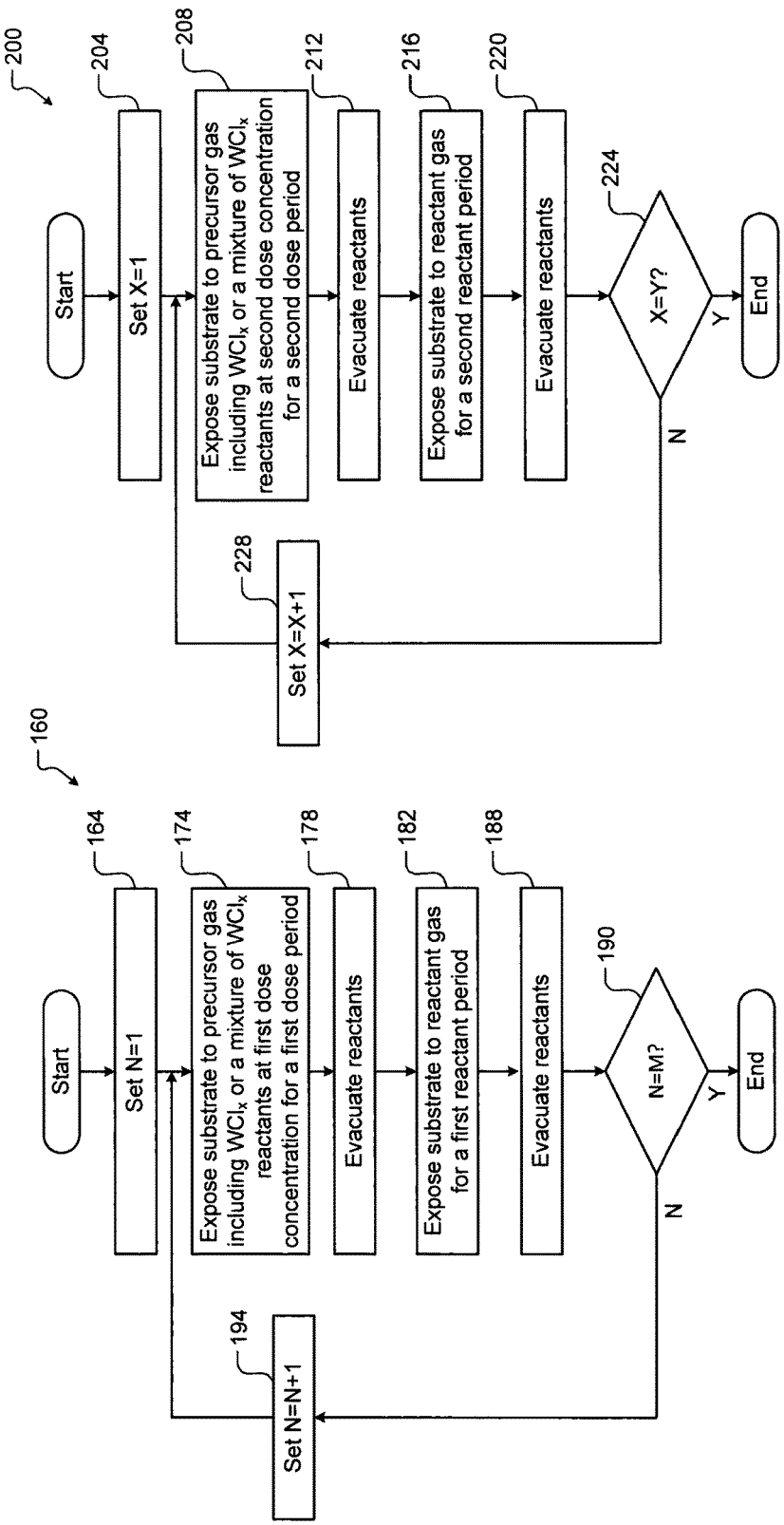

ATOMIC LAYER DEPOSITION OF TUNGSTEN FOR ENHANCED FILL AND REDUCED SUBSTRATE ATTACK

FIELD

The present disclosure relates to substrate processing systems, and more particularly to substrate processing systems for depositing tungsten.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During integrated circuit (IC) manufacturing, transistors are fabricated and then connected together to perform desired circuit functions. The connection process is generally called "metallization" and is usually performed using patterning, etching, and deposition steps.

Tungsten (W) may be used to provide low resistance electrical connections in trenches, vias or contacts. When depositing W, titanium nitride (TiN) is often used as a barrier layer between the W and underlying layers. W may be deposited through the reduction of tungsten hexafluoride ($WF_6$) by molecular hydrogen ($H_2$) or silane ($SiH_4$). However, fluorine-based precursor gases may not be compatible with certain processes. Fluorine-free processes may also be used to deposit W using thermal atomic layer deposition (ALD). However, thermal ALD of W using fluorine-free precursor gas may cause etching of the TiN barrier layer.

ALD is a cyclic process that may be used to deposit W on a substrate by sequentially exposing the substrate in a processing chamber to a precursor gas that is adsorbed onto a surface of the substrate. The processing chamber is purged, exposed to a reactant gas to cause a chemical reaction with the adsorbed precursor, and then purged again. The cycle is repeated multiple times. Heat is used to promote the reaction.

When depositing W, growth enhancers (such as $BH_x$ polymer, $SiH_x$, ...) may be used before the thermal ALD deposition of the W. In addition, a W nucleation layer may be formed by ALD of W precursor with a reducing agent such as $SiH_4$, diborane ($B_2H_6$) or germane ($GeH_4$). However, the growth enhancers and nucleation layers tend to increase the resistivity of the W.

SUMMARY

A method for depositing tungsten includes arranging a substrate including a titanium nitride layer in a substrate processing chamber and performing multi-stage atomic layer deposition of tungsten on the substrate using a precursor gas including tungsten chloride ($WCl_x$) gas, wherein x is an integer. The performing includes depositing the tungsten during a first ALD stage using a first dose intensity of the precursor gas, and depositing the tungsten during a second ALD stage using a second dose intensity of the precursor gas. The first dose intensity is based on a first dose concentration and a first dose period. The second dose intensity is based on a second dose concentration and a second dose period. The second dose intensity is 1.5 to 10 times the first dose intensity.

In other features, the first ALD stage comprises a) exposing the substrate to the precursor gas for the first dose period at the first dose concentration; b) purging the substrate processing chamber after the first dose period; c) exposing the substrate to a reactant gas for a first reactant period; and d) purging the substrate processing chamber after the first reactant period. The second ALD stage comprises e) exposing the substrate to the precursor gas for the second dose period at the second dose concentration; f) purging the substrate processing chamber after the second dose period; g) exposing the substrate to the reactant gas for a second reactant period; and h) purging the substrate processing chamber after the second reactant period.

In other features, a) through d) are repeated M times, wherein M is an integer greater than one, and e) through h) are repeated Y times, wherein Y is an integer greater than one.

In other features, the method includes setting process temperature in the substrate processing chamber to a temperature range from 450° C. to 600° C. The method includes setting a process pressure in the substrate processing chamber to pressure range from 1 Torr to 10 Torr.

In some features, a reactant gas includes at least one gas selected from a group consisting of molecular hydrogen, diborane, silane and germane. The second dose intensity is 2 to 5 times the first dose intensity. A first thickness of the tungsten deposited during the first ALD stage is in a range from 20 Å to 100 Å. A second thickness of the tungsten deposited during the second ALD stage is in a range from 10 Å to 500 Å.

In other features, after the second ALD stage, the method includes repeating the first ALD stage and the second ALD stage.

In other features, after the second ALD stage, the method includes performing T stages at T dose intensities, respectively, wherein T is an integer greater than zero. A first one of the T stages has a higher dose intensity than the second dose intensity, and remaining ones of the T stages have higher dose intensities than preceding ones of the T stages, respectively.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6 is a flowchart illustrating an example of a method for depositing the W layer during a first stage of the multi-stage thermal ALD according to the present disclosure; and FIG. 7 is a flowchart illustrating an example of a method for depositing the W layer during a second stage of the multi-stage thermal ALD according to the present disclosure.

In the drawings, reference numbers may be reused to identify similar and/or identical elements.

DETAILED DESCRIPTION

Figure 1:
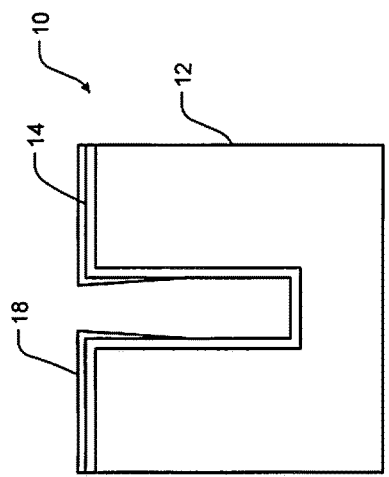
FIGS. 1-3 are side cross-sectional views of an example of a substrate including a titanium nitride (TiN) barrier layer and a tungsten (W) layer deposited on the TiN barrier layer according to the present disclosure.

When depositing tungsten (W), TiN is often used as a barrier layer between the W and underlying substrate layers. However, during deposition of the W using thermal ALD processes with $WCl_x$ as a precursor gas and a reactant gas such as molecular hydrogen ($H_2$), some etching of both titanium nitride (TiN) and tungsten (W) may occur during deposition. As can be appreciated, etching should be minimized to prevent damage to the TiN barrier layer.

TiN and W etch rates during thermal ALD using $WCl_x$ as the precursor gas and a reactant gas such as $H_2$ are dependent on several factors. One of the most important factors is the dose intensity of $WCl_x$ precursor gas. As used herein, dose intensity refers to a product of dose concentration and dose period. For conventional thermal ALD processes, the dose intensity of the $WCl_x$ precursor remains the same for all of the ALD cycles. At relatively low dose intensities, low TiN etching and little or no W etching occurs. At higher dose intensities, high TiN etching and some W etching occurs.

A thermal ALD process for depositing W according to the present disclosure employs multiple thermal ALD stages using different dose intensities. The multi-stage thermal ALD uses a first dose intensity while depositing a first predetermined thickness of W during a first stage. In some examples, the predetermined thickness is in a range from 20 Å to 100 Å. The first dose intensity during the first stage causes less substrate damage but also limits the depth of deposition during feature fill. For example for 3D NAND wordline structures, the dose concentration needed to avoid TiN etch at the top of substrate structures is usually insufficient to provide adequate fill at the bottom of the substrate structures. Other example structures include DRAM buried wordlines, although the methods described herein can be used for any type of substrate. Therefore, the first dose intensity is selected to be relatively low to build up W and protect at least the upper portions of the substrate structures during subsequent stages.

During a second stage of the thermal ALD process, the dose intensity is increased to a second dose intensity. The higher dose intensity deposits the W deeper into the substrate structures without damaging the upper portions of the substrate structures, which are protected by the W deposited during the first stage. In some examples, film deposition during the second stage has a thickness in a range from 10 Å to 500 Å.

In structures with large internal surface areas such as 3D NAND word lines, additional thermal ALD stages with increasing dose intensities may be used to fill all the way to the bottom of the substrate structures without excessive etch of the TiN barrier layer. As an additional benefit, at the high concentrations that are used to fill the bottom portions of the substrate structures, some etching of the deposited W at the top portions of the substrate structures also occurs. The etching can be used to improve overall fill uniformity.

Figure 2:
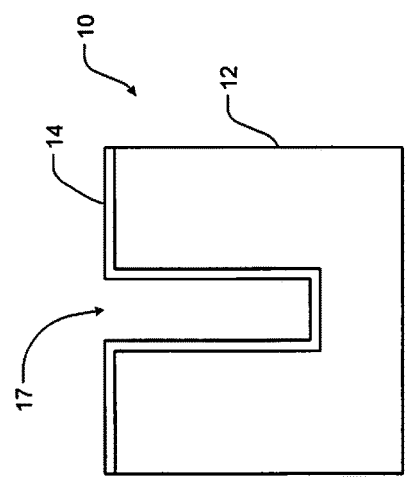
Figure 3:
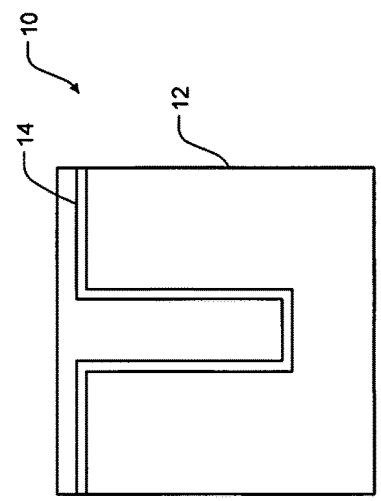

Referring now to FIGS. 1-3, a substrate 10 includes a titanium nitride (TiN) barrier layer 14 deposited on one or more underlying layers 12. In FIG. 1, one or more features 17 for trenches, vias, contacts, etc. may be patterned and defined in the substrate 10 and the TiN barrier layer 14.

In FIG. 2, the substrate 10 is shown after a first stage of a multi-stage thermal ALD process. Deposition is performed using a first dose intensity. A tungsten (W) layer 18 is deposited on upper portions of structures of the substrate 10. The tungsten layer 18 helps to protect the TiN barrier layer 14 during subsequent stages of the multi-stage thermal ALD process. In FIG. 3, the substrate 10 is shown after second stage of the multi-stage thermal ALD process is performed using a second dose intensity that is greater than the first dose intensity.

Figure 4:
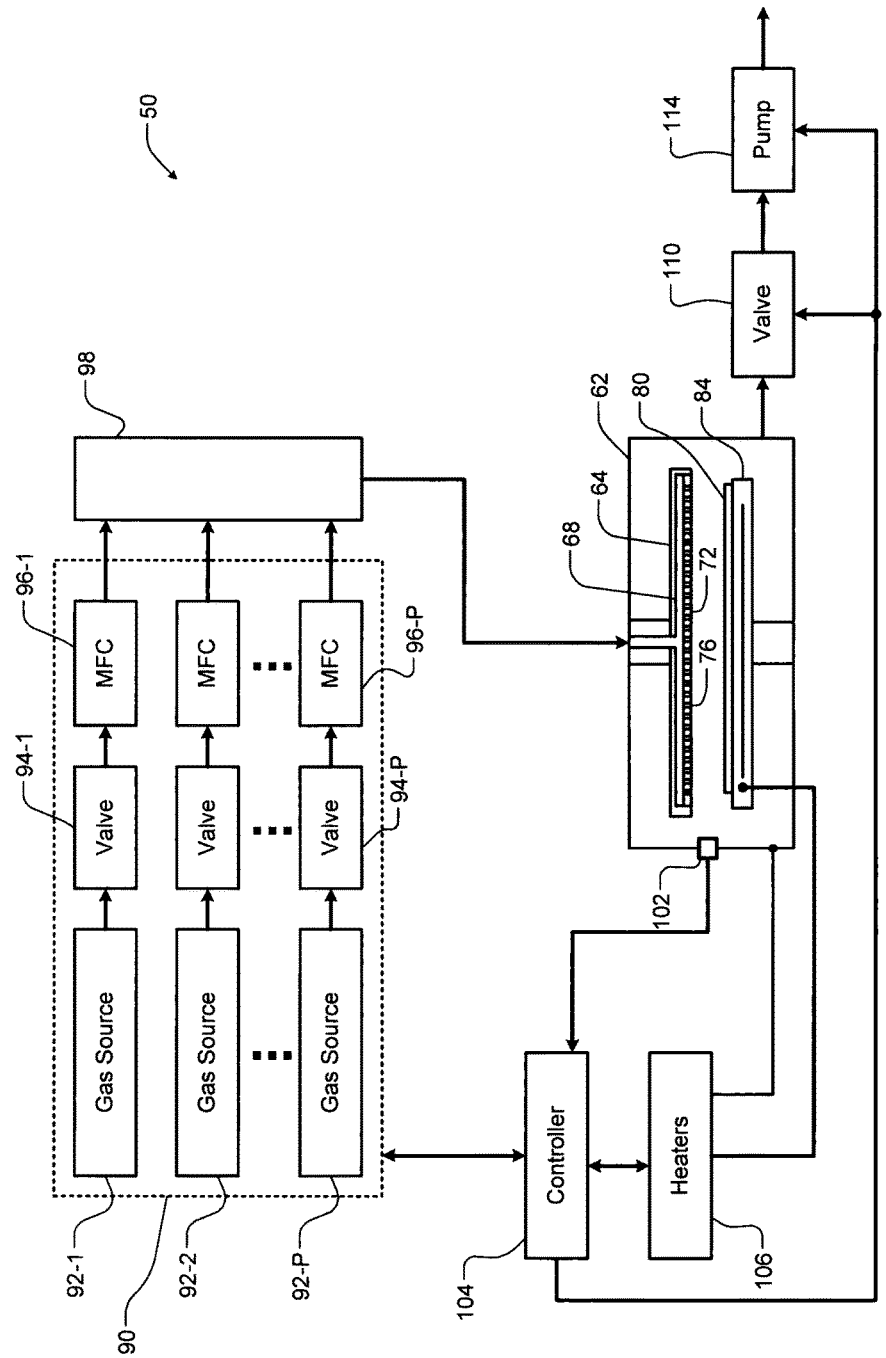
FIG. 4 is a functional block diagram of an example of a substrate processing system for depositing the W layer using multi-stage thermal ALD according to the present disclosure.

Referring now to FIG. 4, a substrate processing system 50 for depositing the W layer using multi-stage thermal ALD is shown. While a particular substrate processing system is shown, other substrate processing systems may be used. The substrate processing system 50 includes a chamber 62. A gas dispersion device or showerhead 64 is located in the chamber 62. The showerhead 64 defines a gas plenum 68 that receives process gas. The showerhead 64 includes a faceplate 72 including spaced through holes 76. The process gas flows into the gas plenum 68 and through the faceplate 72, which uniformly distributes the process gas relative to a substrate 80. The substrate 80 is arranged on a substrate support 84 that lies below the showerhead 64. The substrate support 84 may include an electrostatic chuck (ESC), a pedestal, or any other suitable substrate support.

A gas delivery system 90 includes gas sources 92-1, 92-2, . . . , and 92-P (collectively gas sources 92), where P is an integer greater than one. Valves 94-1, 94-2, and . . . , and 92-P (collectively valves 94) and mass flow controllers (MFC) 96-1, 96-2, and . . . , and 96-P (collectively MFCs 96) control delivery of gases from the gas sources 92-1, 92-2, . . . , and 92-P, respectively. An output of the MFCs 96 is input to a manifold 98, which provides process gas to the showerhead 64.

Sensors 102 such as temperature sensors and/or pressure sensors are arranged in the processing chamber 62 to provide temperature and/or pressure feedback signals to a controller 104. One or more heaters 106 may be used to heat surfaces of the processing chamber 62, the substrate support 84, and/or the showerhead 64. For example, resistive heaters, fluid channels circulating coolant fluid, thermoelectric devices, etc. can be used to control process temperature. An optional valve 110 and a pump 114 (such as a turbomolecular pump) may be used to evacuate reactants from the processing chamber 62 and/or to control pressure within the processing chamber 62. The controller 104 communicates with the sensors 102 and controls the heaters 106, the gas delivery system 90, the valve 110 and the pump 114 as will be described below.

Figure 5:
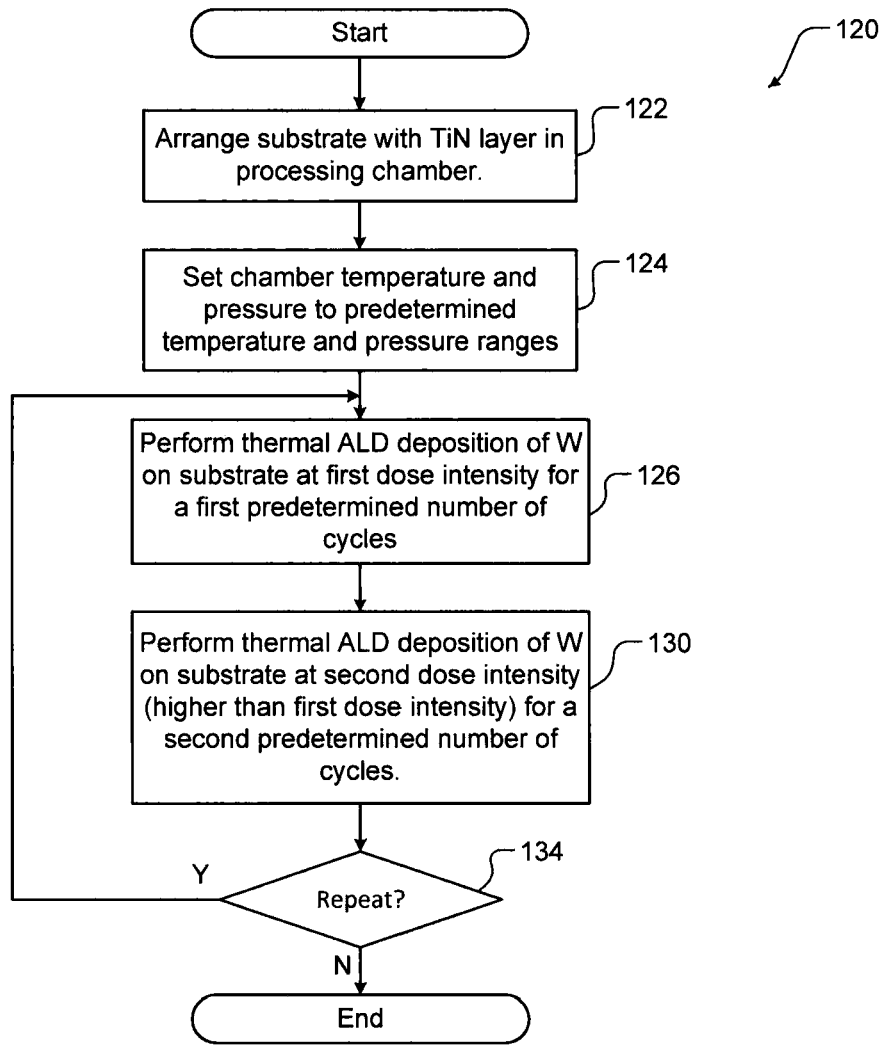
FIG. 5 is a flowchart illustrating an example of a method for depositing the W layer using multi-stage thermal ALD according to the present disclosure.

Referring now to FIG. 5, a method 120 for depositing the W layer using multi-stage thermal ALD process is shown. At 122, a substrate including a titanium nitride (TiN) layer arranged on one or more underlying layers is arranged in the processing chamber. At 124, chamber temperature and pressure are set to predetermined temperature and pressure ranges. In some examples, the chamber temperature is set to a range from 450° C. to 600° C. In some examples, the chamber pressure is set to a pressure range from 1 Torr to 10 Torr. In some examples, the chamber pressure is set to a pressure of 5 Torr.

At 126, a first stage of the multi-stage thermal ALD process is performed. During the first stage, W is deposited using thermal ALD at a first dose intensity for a first predetermined number of ALD cycles. At 130, a second stage of the multi-stage thermal ALD process is performed. During the second stage, W is deposited using thermal ALD at a second dose intensity (greater than the first dose intensity) for a second predetermined number of ALD cycles. At 134, the method determines whether the process should be repeated. Alternately, additional stages may be performed using successively higher dose intensities after 130 instead of repeating the first and second dose intensities. If 134 is true, the method returns to 126. If 134 is false, the method ends.

Referring now to FIG. 6, a method 160 for depositing the W layer during the first stage of the multi-stage thermal ALD is shown. At 164, N is set equal to 1. At 174, the substrate is exposed to a precursor gas for a first dose period at a first dose concentration. In some examples, the precursor gas includes $WCl_x$ or a mixture of $WCl_x$ reactants (where x is an integer such as 2, 4, 5, 6, ...). In some examples, the precursor gas includes $WCl_5$ or $WCL_6$, although other precursors can be used. After the first dose period, the processing chamber is evacuated or purged at 178. In some examples, the processing chamber is purged using an inert gas such as argon (Ar) gas or another noble gas. In still other examples, the processing chamber is purged using molecular nitrogen ($N_2$) gas.

At 182, the substrate is exposed to reactant gas for a first reactant period. In some examples, the reactant gas includes at least one gas selected from a group consisting of molecular hydrogen ($H_2$), silane ($SiH_4$), diborane ($B_2H_6$), and germane ($GeH_4$). In some examples, $H_2$ is used as the reactant gas. In some examples, a combination of gases is used. For example only, a combination of $H_2$ and $SiH_4$ may be used. In some examples, the reactant gas is diluted by argon (Ar) or a noble gas. After the first reactant period, the processing chamber is evacuated or purged at 182. At 190, the method determines whether N equals M (where M is equal to the desired number of ALD cycles). If 190 is false, the method continues at 194 and sets N=N+1. When 190 is true, the method ends.

Referring now to FIG. 7 a method 200 for depositing the W layer during a second stage of the multi-stage thermal ALD is shown. At 204, X is set equal to 1. At 208, the substrate is exposed to the precursor gas for a second dose period at a second dose concentration. In some examples, the precursor gas includes $WCl_x$ or a mixture of $WCl_x$ reactants (where x is an integer such as 2, 4, 5, 6, ...). In some examples, the precursor gas includes $WCl_5$ or $WCL_6$, although other precursors can be used. While the same types of precursor gases may be supplied during the second stage (albeit at a different dose intensity), the precursor gas mixture can also be different for the second stage.

After the second dose period, the processing chamber is evacuated or purged at 212. At 216, the substrate is exposed to the reactant gas for a second reactant period. In some examples, the reactant gas includes at least one gas selected from a group consisting of molecular hydrogen ($H_2$), silane ($SiH_4$), diborane ($B_2H_6$), and germane ($GeH_4$). In some examples, $H_2$ is used as the reactant gas. In some examples, a combination of gases is used. For example only, a combination of $H_2$ and $SiH_4$ may be used. In some examples, the reactant gas is diluted by argon (Ar) or a noble gas. While the same reactant gas mixture may be supplied during the second stage, the reactant gas mixture can also be different for the second stage.

After the second reactant period, the processing chamber is evacuated or purged at 220. At 224, the method determines whether X equals Y (where Y is equal to the desired number of ALD cycles for the second stage). If 224 is false, the method continues at 228 and sets X=X+1. When 224 is true, the method ends.

In some examples, the second (and subsequent) dose intensity of the second (or subsequent) stage is 1.5 to 10 times the first (or prior) dose intensity. In other examples, the second (and subsequent) dose intensity of the second (or subsequent) stage is 2 to 5 times the first (or prior) dose intensity.

In some examples, the dose concentration of $WCl_x$ precursor gas (e.g. $WCl_5$ or any of the other examples described above) during the first stage is between 0.1% and 5% and the first dose period is in a range from 0.05 seconds to 2 seconds. In some examples, the precursor gas is diluted by argon (Ar), a noble gas, molecular nitrogen, etc. In some examples, the first dose concentration of $WCl_x$ precursor gas during the first stage is between 0.1% and 5% and the dose period is in a range from 0.05 seconds to 2 seconds. For example, the dose concentration of $WCl_x$ may be 0.3% for 0.3 seconds during the first stage and 1.5% for 0.5 seconds during the second stage.

In other examples, the dose concentration of $WCl_x$ precursor gas (e.g. $WCl_6$ or any of the other examples described above) during the first stage is between 0.1% and 1% and the first dose period is in a range from 0.05 seconds to 1 second.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for depositing tungsten, comprising:
   arranging a substrate including a titanium nitride layer in a substrate processing chamber;
   performing multi-stage atomic layer deposition of tungsten on the substrate using a precursor gas includes tungsten chloride ($WCl_x$) gas, wherein x is an integer and wherein the performing includes:
      depositing the tungsten during a first ALD stage for M consecutive times using a first dose intensity of the precursor gas, the first dose intensity including at least one of a first dose concentration of the precursor gas ranging between 0.1% and 5% and a dose period ranging between 0.05 seconds and 2 seconds, wherein M is greater than 1;
      depositing the tungsten during a second ALD stage for Y consecutive times using a second dose intensity of the precursor gas, wherein Y is greater than 1;
      depositing the tungsten during a third ALD stage using a third dose intensity of the precursor gas;
   wherein the first dose intensity is based on a first dose concentration and a first dose period,
   wherein the second dose intensity is based on a second dose concentration and a second dose period,
   wherein the second dose intensity is 1.5 to 10 times the first dose intensity, and
   wherein the third ALD stage has a higher dose intensity than the second dose intensity.

2. The method of claim 1, wherein the first ALD stage comprises:
   a) exposing the substrate to the precursor gas for the first dose period at the first dose concentration;
   b) purging the substrate processing chamber after the first dose period;
   c) exposing the substrate to a reactant gas for a first reactant period; and
   d) purging the substrate processing chamber after the first reactant period.

3. The method of claim 2, wherein the second ALD stage comprises:
   e) exposing the substrate to the precursor gas for the second dose period at the second dose concentration;
   f) purging the substrate processing chamber after the second dose period;
   g) exposing the substrate to the reactant gas for a second reactant period; and h) purging the substrate processing chamber after the second reactant period.

4. The method of claim 1, further comprising setting process temperature in the substrate processing chamber to a temperature range from 450° C. to 600° C.

5. The method of claim 1, further comprising setting process pressure in the substrate processing chamber to a pressure range from 1 Torr to 10 Torr.

6. The method of claim 2, wherein the reactant gas includes at least one gas selected from a group consisting of molecular hydrogen, diborane, silane and germane.

7. The method of claim 1, wherein the second dose intensity is 2 to 5 times the first dose intensity.

8. The method of claim 1, wherein a first thickness of the tungsten deposited during the first ALD stage is in a range from 20 Å to 100 Å.

9. The method of claim 1, wherein a second thickness of the tungsten deposited during the second ALD stage is in a range from 10 Å to 500 Å.

10. A method for depositing tungsten, comprising:
arranging a substrate including a titanium nitride layer in a substrate processing chamber;
performing multi-stage atomic layer deposition of tungsten on the substrate using a precursor gas including tungsten chloride ($WCl_x$) gas where x is an integer and a reactant gas including at least one gas selected from a group consisting of molecular hydrogen, diborane, silane and germane,
wherein the performing includes:
depositing the tungsten during a first ALD stage for M consecutive times using a first dose intensity of the precursor gas, the first dose intensity including at least one of a first dose concentration of the precursor gas ranging between 0.1% and 5% and a dose period ranging between 0.05 seconds and 2 seconds, wherein M is greater than 1;
depositing the tungsten during a second ALD stage for Y consecutive times using a second dose intensity of the precursor gas, wherein Y is greater than 1;
after the second ALD stage, performing a third ALD stage;
wherein the first dose intensity is based on a first dose concentration and a first dose period,
wherein the second dose intensity is based on a second dose concentration and a second dose period,
wherein the second dose intensity is 1.5 to 10 times the first dose intensity, and
wherein the third ALD stage has a higher dose intensity than the second dose intensity.

11. The method of claim 10, wherein:
the first ALD stage comprises:
a) exposing the substrate to the precursor gas for the first dose period at the first dose concentration;
b) purging the substrate processing chamber after the first dose period;
c) exposing the substrate to the reactant gas for a first reactant period; and
d) purging the substrate processing chamber after the first reactant period; and
the second ALD stage comprises:
e) exposing the substrate to the precursor gas for the second dose period at the second dose concentration;
f) purging the substrate processing chamber after the second dose period;
g) exposing the substrate to the reactant gas for a second reactant period; and
h) purging the substrate processing chamber after the second reactant period.

12. The method of claim 10, further comprising:
setting process temperature in the substrate processing chamber to temperature range from 450° C. to 600° C.; and
setting process pressure in the substrate processing chamber to pressure range from 1 Torr to 10 Torr.

13. The method of claim 10, wherein the second dose intensity is 2 to 5 times the first dose intensity.

14. The method of claim 10, wherein:
a first thickness of the tungsten deposited during the first ALD stage is in a range from 20 Å to 100 Å; and
a second thickness of the tungsten deposited during the second ALD stage is in a range from 10 Å to 500 Å.

* * * * *